(12) United States Patent
Dougherty et al.

(10) Patent No.: US 7,119,518 B1
(45) Date of Patent: Oct. 10, 2006

(54) BATTERY TESTER

(75) Inventors: Thomas J. Dougherty, Waukesha, WI (US); Ronald C. Miles, Whitefish Bay, WI (US); Michael L. Thompson, East Troy, WI (US)

(73) Assignee: Johnson Controls Technology Company, Holland, MI (US)

( * ) Notice: Subject to any disclaimer, the term of this patent is extended or adjusted under 35 U.S.C. 154(b) by 0 days.

(21) Appl. No.: 10/976,340

(22) Filed: Oct. 28, 2004

Related U.S. Application Data

(60) Provisional application No. 60/515,007, filed on Oct. 28, 2003.

(51) Int. Cl.
*H02J 7/00* (2006.01)

(52) U.S. Cl. ...................... 320/117; 324/426
(58) Field of Classification Search ............... 320/117; 324/426, 429
See application file for complete search history.

(56) References Cited

U.S. PATENT DOCUMENTS

| | | | | | |
|---|---|---|---|---|---|
| 4,071,822 | A | * | 1/1978 | Kamiya | 324/426 |
| 6,100,665 | A | * | 8/2000 | Alderman | 320/127 |
| 6,522,902 | B1 | * | 2/2003 | Nishihara et al. | 320/117 |

* cited by examiner

*Primary Examiner*—Karl Easthom
*Assistant Examiner*—Robert Grant
(74) *Attorney, Agent, or Firm*—Foley & Lardner LLP

(57) ABSTRACT

A system for testing a battery includes a first capacitor and a second capacitor. The first capacitor and the second capacitor are configured to be arranged in series in a first arrangement and in parallel in a second arrangement. The first capacitor and the second capacitor may be cycled between the first arrangement and the second arrangement to characterize a response of a battery.

20 Claims, 5 Drawing Sheets

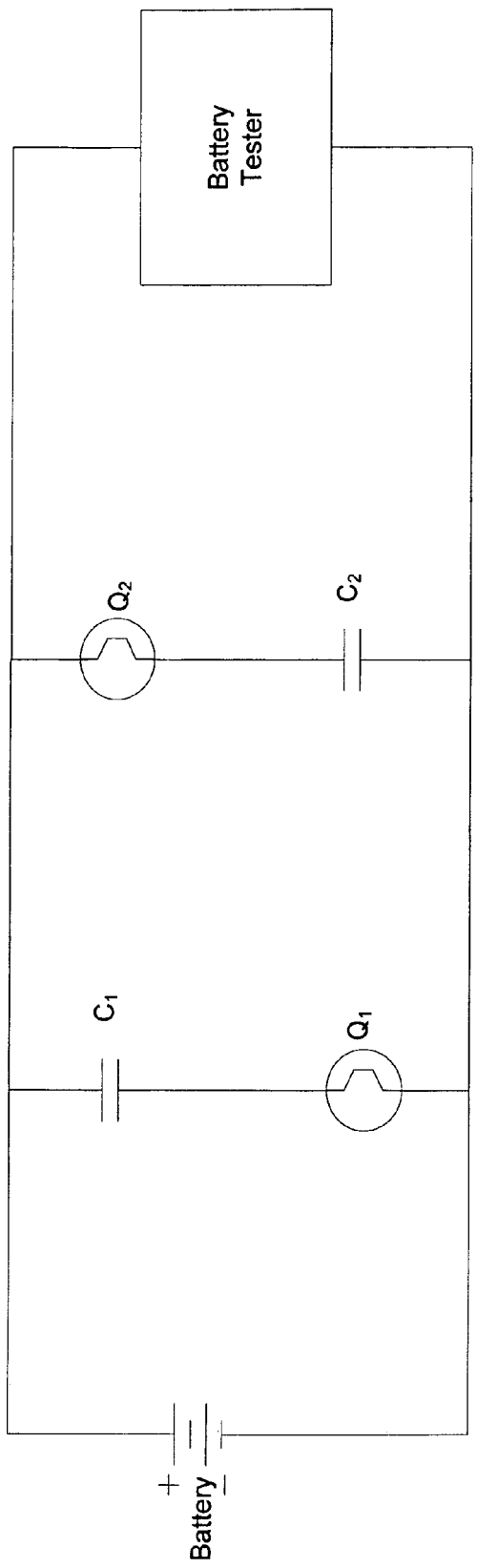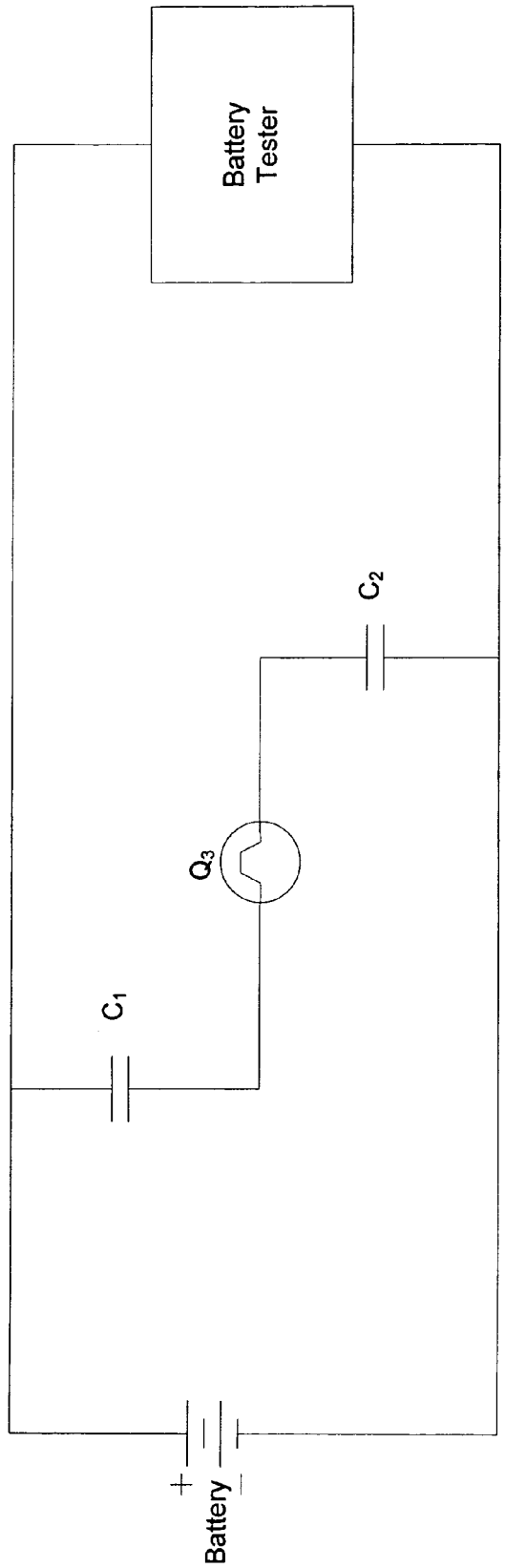

BATTERY TESTER

CROSS-REFERENCE TO RELATED APPLICATIONS

This application claims the benefit of U.S. Patent Application No. 60/515,007 filed Oct. 28, 2003. The following patent application is expressly incorporated by reference herein in its entirety: U.S. Patent Application No. 60/515,007 filed Oct. 28, 2003.

BACKGROUND

The present invention relates to systems for testing or evaluating (e.g., analyzing, assessing, checking, characterizing, etc.) batteries (e.g., batteries such as lead-acid starting, lighting, and ignition (SLI) batteries, industrial batteries, commercial batteries, marine batteries, etc.). More specifically, the present invention relates to battery testers that utilize storage devices such as capacitors to test various features of batteries.

Various testing systems (e.g., battery testers) have been utilized in order to determine features of batteries, such as the voltage or current of a battery. However, such systems do not provide a simple way to charge and discharge a battery in which heating of the tester is minimized. Further, such systems do not provide a relatively simple and efficient way to characterize responses (e.g., voltage and current responses) of a battery during charging and discharging of the battery.

It would be advantageous to provide a system for testing a battery (e.g., a battery tester) which may be used to analyze a response of a battery during charging and discharging of a battery. It would also be advantageous to provide a battery tester which reduces the amount of heating of the battery tester as compared to conventional battery testers when discharging a battery. It would also be advantageous to provide a method of characterizing a response of a battery during charging and discharging operations. It would be advantageous to provide a system and/or method that provides any one or more of these or other advantageous features.

SUMMARY

The present invention relates to a system for testing a battery that includes a first capacitor and a second capacitor. The first capacitor and the second capacitor are configured to be arranged in series in a first arrangement and in parallel in a second arrangement.

The present invention also relates to a system for testing a battery that includes a first group of capacitors and a second group of capacitors. The first group of capacitors and the second group of capacitors may be selectively switched between a first configuration in which the first group of capacitors and the second group of capacitors are in series with each other and a second configuration in which the first group of capacitors and the second group of capacitors are in parallel with each other.

The present invention further relates to a method for testing a battery that includes discharging a battery into a first capacitor and a second capacitor when the first capacitor and the second capacitor are provided in parallel with each other. The method also includes arranging the first capacitor and the second capacitor in series with each other and charging the battery by discharging the first capacitor and the second capacitor into the battery when the first capacitor and the second capacitor are in series with each other.

BRIEF DESCRIPTION OF THE DRAWINGS

FIG. 3 is a schematic diagram of a portion of the circuit (e.g., an "equivalent" circuit) shown in FIG. 1 illustrating the arrangement of capacitors during discharge of a battery.

FIG. 4 is a schematic diagram of a portion of the circuit (e.g., an "equivalent" circuit) shown in FIG. 1 illustrating the arrangement of capacitors during charging of a battery.

DETAILED DESCRIPTION OF EXEMPLARY EMBODIMENTS

According to an exemplary embodiment, a battery test system (e.g., a battery tester) may be used for testing or characterizing vehicle batteries (e.g., 12 V starting, lighting, and ignition batteries). The battery tester may include connectors (e.g., clips or other connectors) configured to be coupled or attached to terminals of a battery (e.g., a positive and a negative terminal).

The battery tester may include software and/or circuitry configured to measure various characteristics of a battery (e.g., voltage, current, voltage and/or current response, impedance, resistance, etc.). The battery tester may include software that pulses or cycles charging and discharging of a battery according to one or more algorithms.

According to an exemplary embodiment, the battery tester includes circuitry that includes one or more elements for characterizing internal resistance of the battery (e.g., a resistive element such as a resistor or load). One nonexclusive example of such an element is shown as resistor R1 in FIG. 1. According to an exemplary embodiment, resistor R1 has a rating of between approximately 0.5 and 5000 ohms. According to a preferred embodiment, the resistor has a rating of between approximately 10 and 100 ohms. According to an alternative embodiment, a plurality of resistors may be provided.

A switch (e.g., a mechanical switch or a transistor such as a MOSFET) is provided to electrically connect the resistor (e.g., resistor R1) to the battery. One nonexclusive example of such a switch is shown in FIG. 1 as switch Q4.

The resistor (e.g., R1) can be connected to the battery when the switch (e.g., Q4) is in the "on" or "high" state. With the switch (e.g., Q4) in the "on" state, the change in voltage across the terminals of the battery can be measured to characterize, determine, and/or analyze the battery resistance.

When the switch (e.g., Q4) is in the "on" state, the other switches (e.g., Q1, Q2, and Q3) are switched to the "off" state. In this arrangement, a closed circuit is formed with resistor R1 and switch Q4, while an open circuit is formed across switches Q1, Q2, and Q3. The result is a circuit having resistor R1 in series with the battery.

Figure 1:
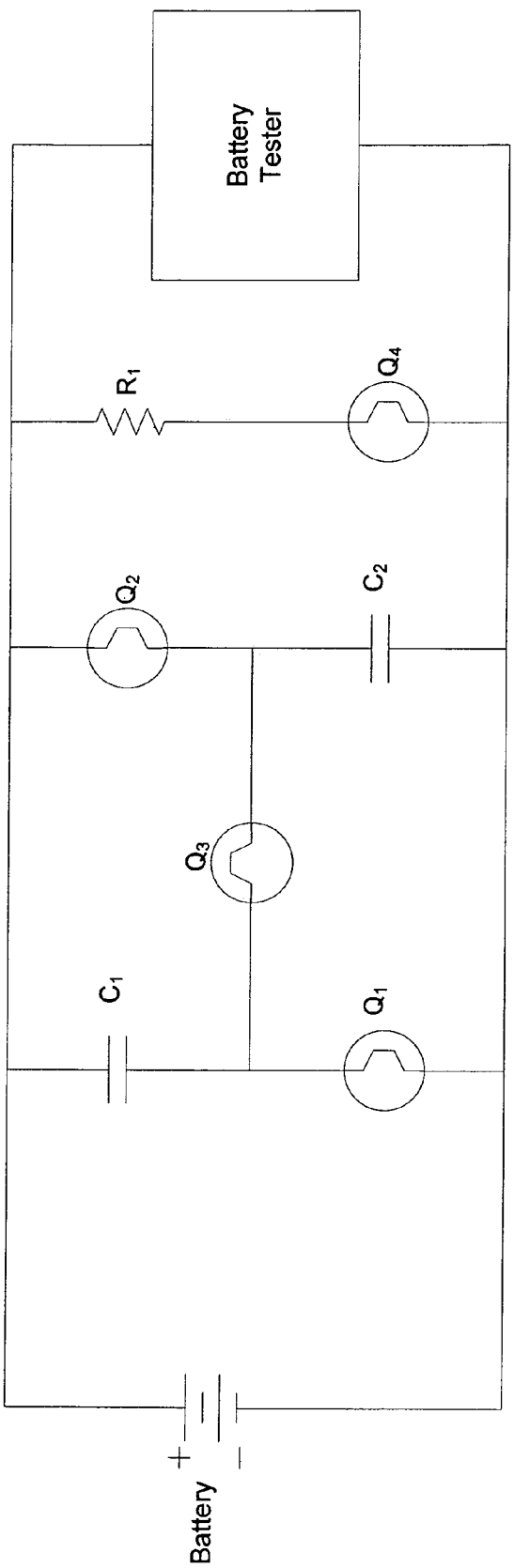
FIG. 1 is a schematic diagram of a circuit for a capacitive battery test system in accordance with an exemplary embodiment.
Figure 2:
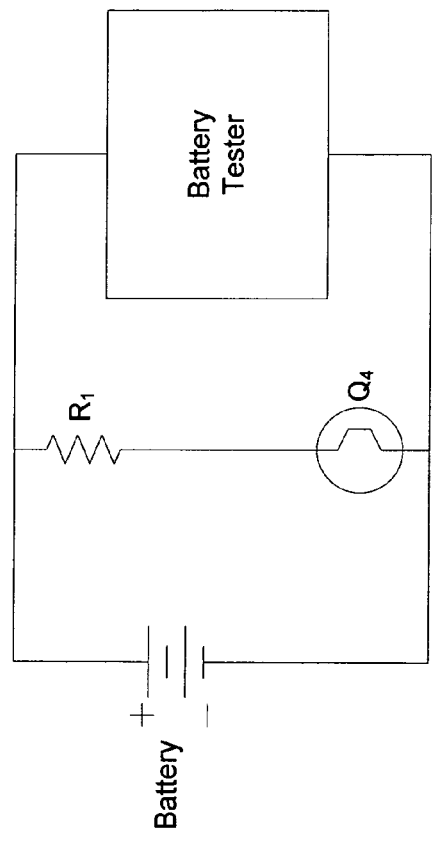
FIG. 2 is a schematic diagram of a portion of the circuit (e.g., an "equivalent" circuit) shown in FIG. 1 illustrating the arrangement of the circuit during resistance testing of a battery.

A simplified schematic diagram of the circuit shown in FIG. 1 (e.g., an equivalent circuit) is provided in FIG. 2 illustrating the effective arrangement of the circuit when switch Q4 is in the "on" state and other switches in the circuit (e.g., shown as switches Q1, Q2, and Q3 in FIG. 1) are in an "off" or "low" state.

The battery tester measures the change in voltage across resistor R1 (or across the plurality of resistors provided in place of resistor R1 according to an alternative embodiment). Upon determining the battery resistance, switch Q4 is opened and remains open through the remainder of the charging and discharging cycle.

The battery tester circuitry may include two or more capacitors for charging and/or discharging a battery. FIG. 1 illustrates the use of two groups or banks of capacitors (e.g., represented as capacitors C1 and C2). Such banks of capacitors may include five or more capacitors according to an exemplary embodiment. According to other exemplary embodiments, a different number of capacitors may be utilized (e.g., one or more capacitors). For brevity, C1 and C2 are referred to herein as "capacitors," although C1 and C2 may each include more than one capacitor.

C1 and C2 may include a number of capacities that each have a capacitance of between approximately 20 and 60 farads. According to alternative embodiments, the capacitors may have a capacitance of greater than 60 farads. According to an exemplary embodiment in which capacitors C1 and C2 each comprise five 60-farad capacitors, the total capacitance of each of the capacitors C1 and C2 is 12 farads.

Any number of capacitors may be provided in each of the capacitor banks C1 and C2, and each of the capacitors included in the capacitor banks may have any suitable capacitance. According to an exemplary embodiment, the capacitance of each of the capacitors included in the capacitor banks is selected to provide a capacitance for the battery tester adequate to perform charging and discharging operations when the battery tester is coupled to a battery (e.g., 12 V battery).

One advantageous feature of utilizing a plurality of capacitors as capacitor banks is that the benefits of using a large-capacity capacitor may be obtained by providing several smaller-capacity capacitors. According to other exemplary embodiments, the banks of capacitors may be replaced with single, larger-capacity capacitors.

Capacitor C1 may be arranged in parallel with capacitor C2 or in series with capacitor C2 by utilizing a switching mechanism or device (e.g., a switch).

A number of switches (e.g., Q1, Q2, Q3, and Q4 in FIG. 1) are provided in the circuit and may be switched between "on" and "off" states. The switches may be MOSFETs having relatively low resistances (e.g., between approximately 0.2 and 20 ohms). According to an alternative embodiment, one or more of the switches may have a rating (e.g., amps and resistance) that differs from the other switches (e.g., Q3 and Q4 shown in FIG. 1 may have a rating that differs from that of Q1 and/or Q2). According to other alternative embodiments, other types of transistors/MOSFETs may be utilized.

According to an exemplary embodiment, two of the switches (e.g., Q1 and Q2) are coupled together, such that both of the switches are maintained in the same state (e.g., either both "on" or both "off"). According to an alternative embodiment, the switches are switched separately such that a signal is transmitted to each individual transistor (e.g., the switches are operated separately).

Switch Q3 receives the opposite signal as that provided to switches Q1 and Q2 (e.g., when Q1 and Q2 are in the "on" state, Q3 is in the "off" state). According to an alternative embodiment, instead of providing a separate signal to the third switch, an inverter may be placed in line with the signal transmitted to switches Q1 and Q2 so that the opposite signal is provided to the third switch. According to other alternative embodiments, other methods may be used to ensure that switch Q3 is maintained in the opposite state as switches Q1 and Q2.

The remaining switch (e.g., Q4) is in the "off" state when either of switches Q1 and Q2 are in the "on" state or when switch Q3 is in the "on" state. Switches Q1 and Q2 are provided in the circuit such that when they are in the "on" state, capacitors C1 and C2 are arranged in parallel with each other.

A simplified schematic diagram (e.g., an "equivalent" circuit) of the circuit shown in FIG. 1 is provided in FIG. 3 illustrating the parallel arrangement of the capacitors when switches Q1 and Q2 are in the "on" state and switches Q3 and Q4 are in the "off" state.

When switches Q1 and Q2 are in the "on" state, switches Q3 and Q4 are switched to the "off" state, and a closed circuit is formed with capacitor C1, switch Q1, switch Q2, and capacitor C2, while an open circuit is formed across switches Q3 and Q4. The result is a circuit having capacitors C1 and C2 arranged in parallel.

Switches Q1 and Q2 are provided in the circuit such that when they are in the "off" state, capacitors C1 and C2 are arranged in series with each other. A simplified schematic diagram (e.g., an "equivalent" circuit) of the circuit shown in FIG. 1 is provided in FIG. 4 illustrating the series arrangement of capacitors C1 and C2 when switches Q1, Q2, and Q4 are in the "off" state and switch Q3 is in the "on" state.

When switches Q1, Q2, and Q4 are in the "off" state, switch Q3 is in the "on" state, and a closed circuit is formed with capacitor C1, switch Q3, and capacitor C2, while an open circuit is formed across switches Q1, Q2, and Q4. The result is a circuit having capacitor C1 and C2 arranged in series.

During discharging of the battery (i.e., drawing current from the battery), capacitors C1 and C2 are arranged in parallel with each other. By arranging the capacitors in parallel during discharging of the battery, the amount of heat generated is decreased (e.g., the amount of heat may be reduced by up to approximately 90 percent or more).

During charging of the battery (i.e., inputting current to the battery), capacitors C1 and C2 are arranged in series with each other. By arranging the capacitors in series during charging of the battery, the amount of voltage provided to the battery is increased. For example, if each of capacitors C1 and C2 acts as a 12 V charge source, placing the two capacitors in series provides a 24 V charge source.

According to an exemplary embodiment, a system for testing or evaluating batteries (e.g., a battery test system or battery tester such as a capacitive tester) includes circuitry that allows a set of capacitors (e.g., two capacitors or two banks of capacitors) to be selectively arranged in parallel or in series using switching devices (e.g., transistors such as MOSFET type transistors) to switch the capacitors between parallel and series configurations. For the sake of brevity, this description will use the term "capacitor" even though banks of capacitors may be utilized.

One advantageous feature of the inventions disclosed herein is that the arrangement of the capacitors or banks of capacitors in parallel with the battery provides a relatively high current method of draining charge from the battery. By arranging the capacitors in series once charge has been drawn from the battery, a relatively high voltage charging of the battery using charge previously drawn from the battery may be accomplished. In this manner, the capacitors may be used both to draw charge from the battery and to re-charge the battery subsequent to drawing charge from the battery.

FIG. 1 shows an exemplary embodiment of a portion of a circuit included in a battery tester (e.g., a capacitive battery tester). The battery tester may be coupled to the terminals of a battery that is to be tested or evaluated. The battery tester may measure the voltage and/or current response of the battery and may also determine other characteristics of the battery.

Referring to FIG. 1, the battery tester circuitry comprises four switches, two of which (e.g., Q1 and Q2) are maintained in the same state (e.g., either both "on" or both "off"). One of the other switches (e.g., Q3) is maintained in the opposite state as the first two switches to provide a series or parallel arrangement of the capacitators (e.g., if the first two switches are in the "on" state, the third switch is in the "off" state). The remaining switch (e.g., Q4) is in the "off" state when any of switches Q1, Q2 and Q3 are in the "on" state.

According to an exemplary embodiment, each of the switches is a MOSFET having a relatively low resistance (e.g., 0.01 ohms or less). According to alternative embodiments, different types of switches/MOSFETs may be utilized. According to other alternative embodiments, switches Q3 and Q4 may have a different rating than Q1 and Q2, or all four switches may have different ratings.

FIG. 2 is a schematic diagram of a portion of the circuit (e.g., an "equivalent circuit) shown in FIG. 1, illustrating the arrangement of the circuit during testing of battery resistance. One of the switches (e.g., Q4 shown in FIG. 1) is in an "on" state and the other switches (e.g., Q1, Q2, and Q3) are in an "off" state. A closed loop circuit is formed between a resistor (e.g., R1) and switch Q4. A micro-current is then sent through the battery by the battery tester. The micro-current aids measurement of the battery resistance (e.g., by allowing the battery tester to measure the voltage drop between the battery terminals to characterize the battery resistance). Subsequent to the battery resistance measurement, switch Q4 switches from the "on" state to the "off" state, and an open circuit is formed across switch Q4.

The capacitors (e.g., C1 and C2 shown in FIG. 1) of the circuit are arranged or provided in parallel with each other during a discharging operation in which at least a portion of the charge from the battery is discharged into the capacitors. In this manner, heat dissipated from the battery tester may be reduced as compared to conventional battery testers.

FIGS. 3 and 4 are simplified schematic circuit diagrams (e.g., "equivalent" circuits) that show the effect of turning the switches on and off. As shown in FIGS. 1 and 3, when switches Q1 and Q2 are in the "on" state, a circuit is completed that includes capacitors C1 and C2 in parallel with each other. That is, when switches Q1 and Q2 are switched to the "on" state, a closed loop is formed that includes both capacitors C1 and C2 and switches Q1 and Q2 such that current flows through the circuit with capacitors C1 and C2 in parallel. Because switches Q3 and Q4 are turned off when switches Q1 and Q2 are turned on, no current flows through those portions of the circuit where Q3 and Q4 are provided (e.g., an "open circuit" is formed through the branch of the circuit in which switch Q3 is provided).

According to an alternative embodiment, capacitors C1 and C2 may be arranged in parallel when the associated switches (e.g., Q1 and Q2) are turned off instead of when they are turned on (e.g., an inverter or other component may be used to reverse the signal).

During discharging of the battery into the capacitors, the voltage of the battery drops relatively sharply and then recovers gradually as the capacitors charge. Such a voltage drop and recovery may be analyzed to provide information as to the size or capacity of the battery. It should be noted that size and resistance (ESR) of the capacitor(s) affect the magnitude of the voltage drop of the battery and the rate at which the battery voltage recovers.

According to an exemplary embodiment, capacitors C1 and C2 each include five capacitors, each of which has a capacitance of between approximately 20 and 60 farads (i.e., where five 60-farad capacitors are provided for C1, the total capacitance of C1 is 12 farads). According to an alternative embodiment, other numbers and/or types of capacitors may be used. The capacitors may be charged either fully or partially by the battery discharge, depending on the particular charging/discharging algorithm used. According to an exemplary embodiment, the capacitors are charged in between approximately 0.1 and 5 seconds. According to alternative embodiments, shorter or longer times may be used, and the capacitors may or may not be fully charged.

To discharge the capacitors and recharge the battery, capacitors C1 and C2 are arranged or provided in series by switching the transistors to their opposite state using computer software or other means. For example, where capacitors C1 and C2 are in parallel when switches Q1 and Q2 are in the "on" state and switches Q3 and Q4 are in the "off" state, capacitors C1 and C2 may be arranged in series by switching switches Q1 and Q2 to the "off" state and switch Q3 to the "on" state. Switch Q4 remains in the "off" state. As shown in the simplified schematic circuit diagram of FIG. 4, an open circuit is formed across switches Q1, Q2, and Q4, and a closed circuit is formed across switch Q3, which allows current to flow through capacitors C1 and C2 in a series arrangement. Where a charge voltage of 12 V may be obtained using a single capacitor, two capacitors in series may provide a charge voltage of 24 V). In this manner, the arrangement of the capacitors in series may provide a higher voltage to charge the battery. The amount of time for discharging of the capacitors may vary according to various preferred and exemplary embodiments, and may be optimized to measure various characteristics of the battery to which the battery tester is coupled.

Because the battery tester both discharges the battery into the capacitors and discharges the capacitors into the battery, various features of the battery may be monitored (e.g., discharge voltage and/or current response, charging voltage and/or current response, etc.) to evaluate or characterize the battery. For example, batteries may be characterized based on one or more features to determine if one or more plates, cells, or other components of the batteries are defective. In characterizing a battery, the waveforms for current and/or voltage may be monitored over a predetermined time period during charging and/or discharging of the battery.

The capacitors of the battery tester may also be cycled between series and parallel arrangements one or more times to characterize the voltage or current response of a battery to which the battery tester is coupled. For example, the capacitors may be cycled between a series and parallel arrangement at a frequency of up to approximately 10,000 Hz (e.g., 5 Hz, 10 Hz, 100 Hz, 1,000 Hz, or any other frequency that may be appropriate). Such cycling may allow characterization of the impedance of the battery (e.g., to characterize various aspects of the battery, including various aspects of battery plate or electrode physics).

Figure 5:
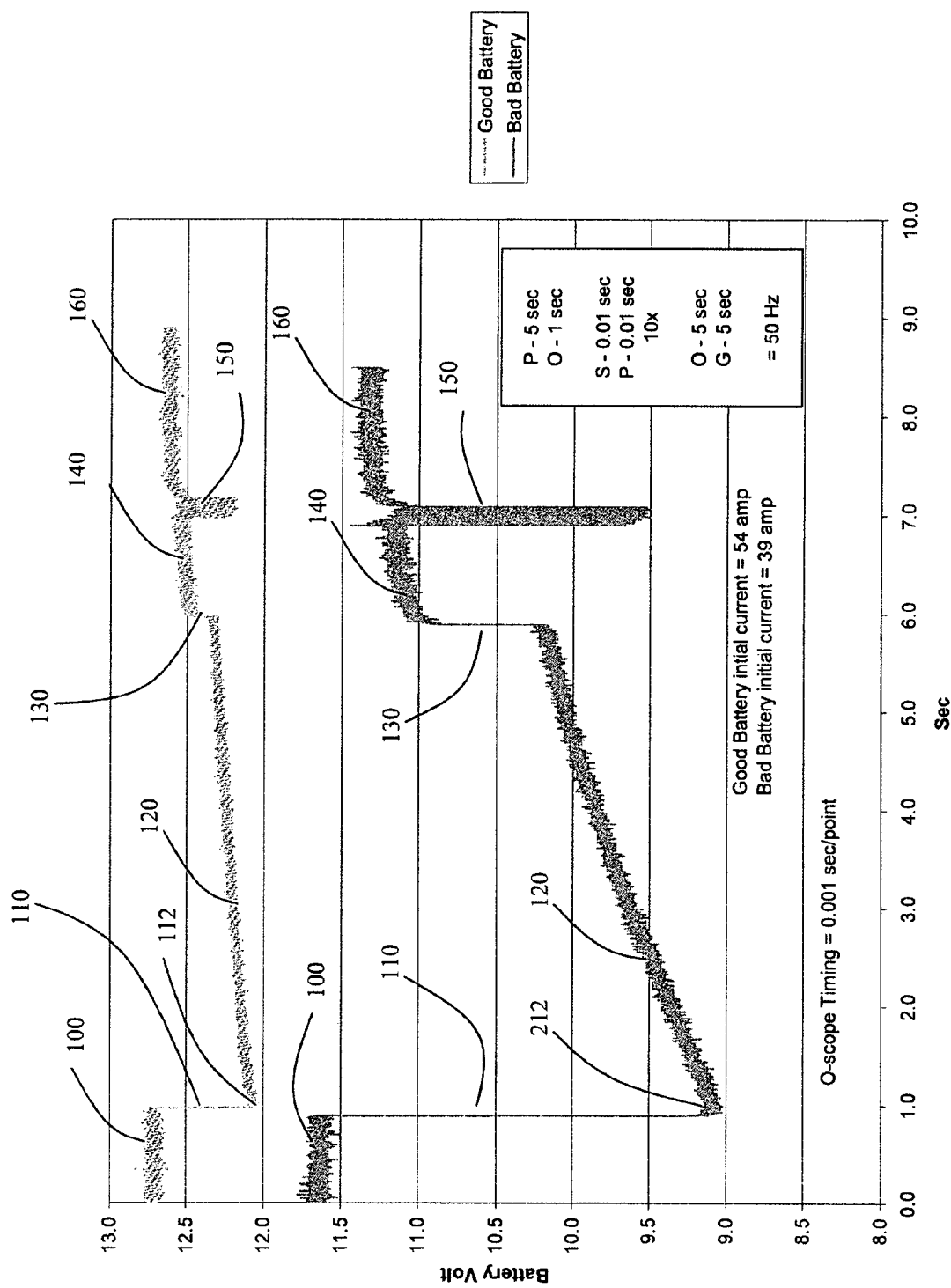
FIG. 5 is a graphical representation showing the voltage response of a good (e.g., fully charged) battery as compared to the voltage response of a bad battery (e.g., a battery that has insufficient charge to perform according to a predetermined standard) according to an exemplary embodiment.
Figure 6:
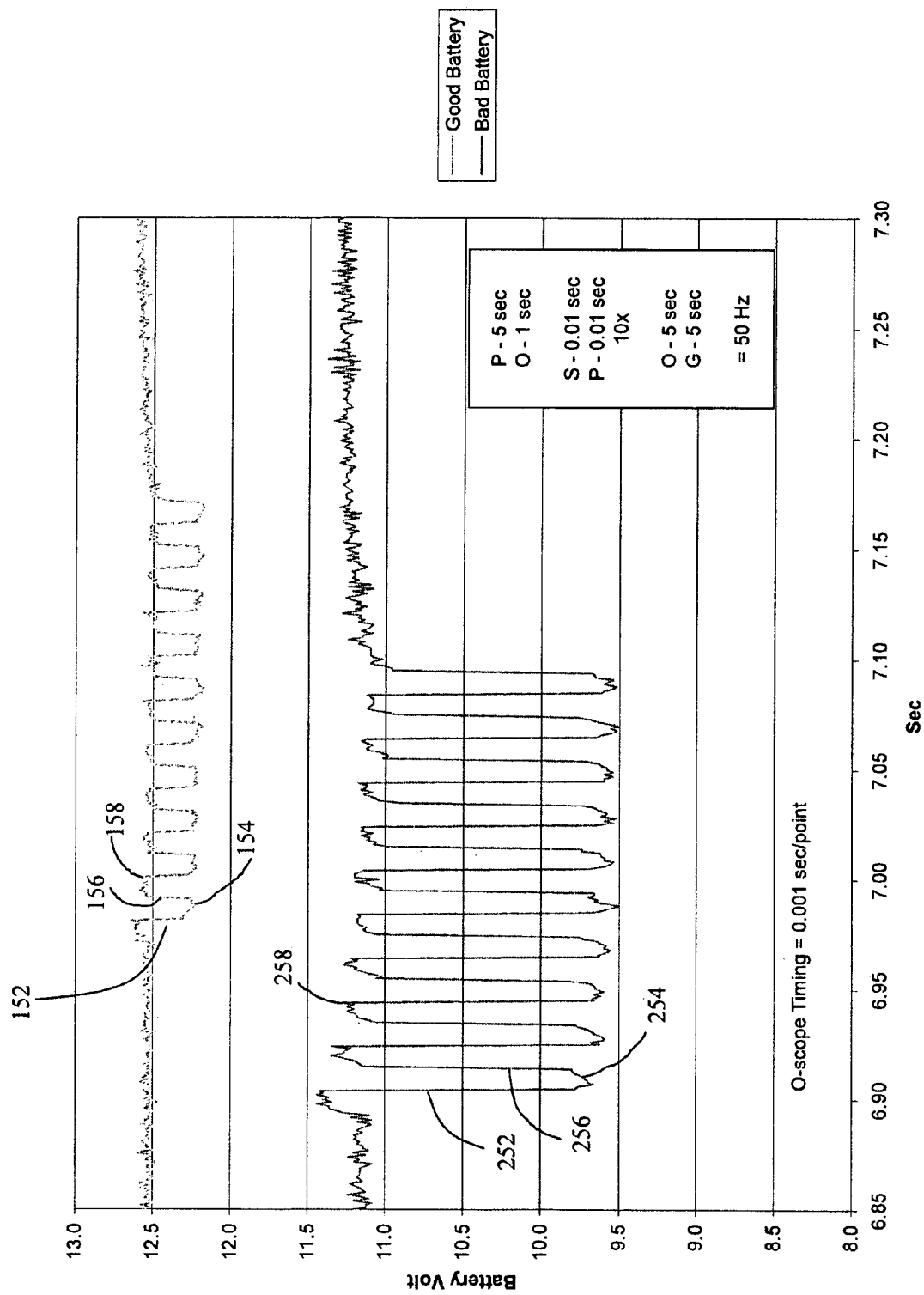
FIG. 6 is a graphical representation showing a portion of the graphical representation shown in FIG. 5.
Figure 7:
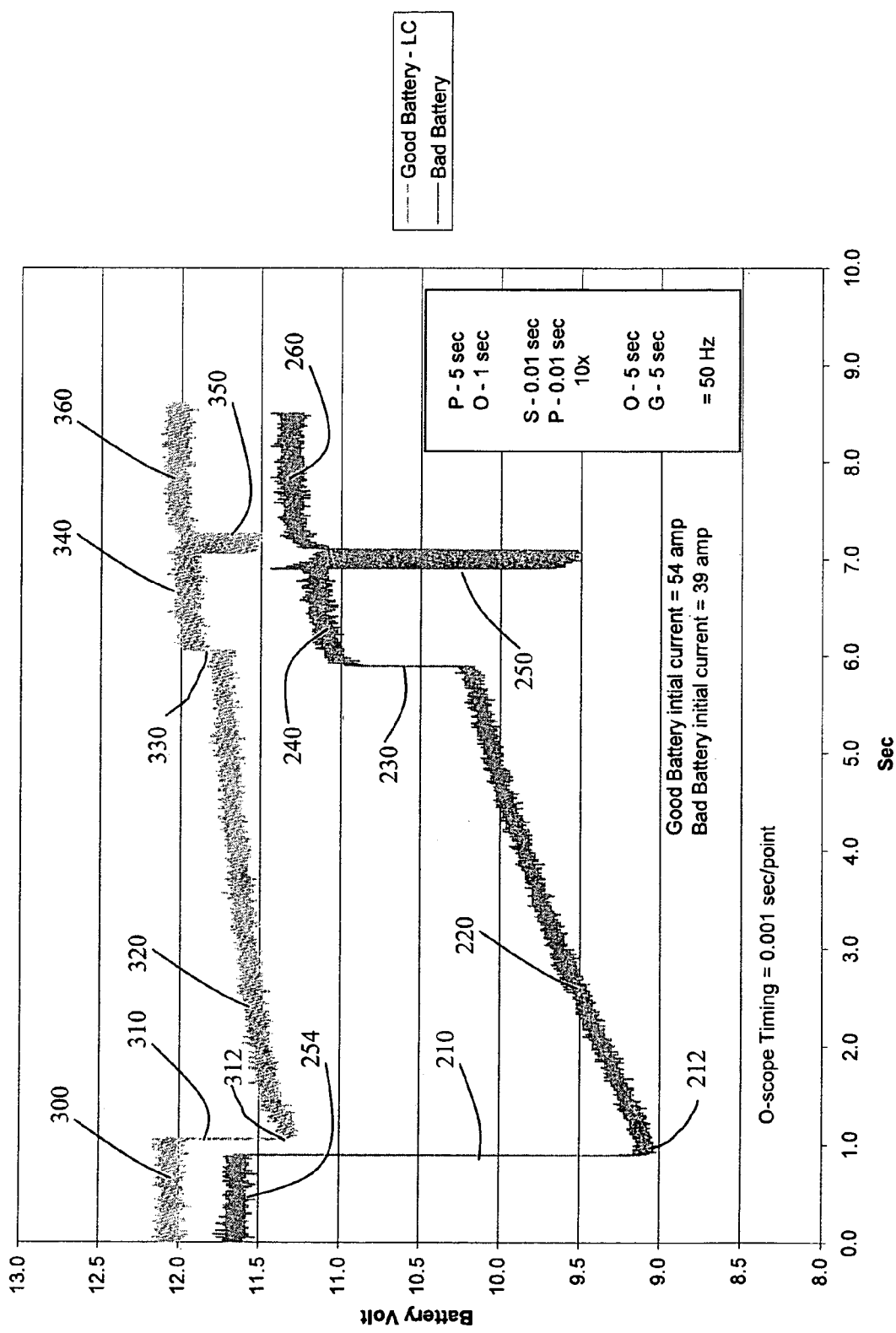
FIG. 7 is a graphical representation showing the voltage response of a relatively low state-of-charge battery as compared to the voltage response of a bad battery according to another exemplary embodiment.

FIGS. 5–7 are graphical representations that show data obtained using a battery tester including circuitry similar to that described above with respect to FIGS. 1–4. According to an exemplary embodiment, a 12 V lead-acid battery produced by Optima Batteries, Inc. was tested using a battery tester that utilized banks of capacitors having 60 farad capacitors provided therein.

FIG. 5 shows the voltage response of a good (e.g., fully charged) battery as compared to the voltage response of a bad battery (e.g., a battery that has insufficient charge to perform according to a predetermined standard) according to an exemplary embodiment. FIG. 7 shows the voltage response of a relatively low state-of-charge battery as compared to the voltage response of the bad battery according to another exemplary embodiment. Voltage response data obtained from the good battery is represented as curve 100, from the bad battery is represented as curve 200, and from the relatively low state-of-charge battery is represented as curve 300.

According to an exemplary embodiment, at approximately one second into the testing routine, the capacitors (e.g., C1 and C2) of the battery tester are arranged in parallel (e.g., by closing switches Q1 and Q2 and opening switch Q3). Placing the capacitors in parallel acts to draw charge from the battery, which is represented as a voltage drop in the battery (labeled as regions 110, 210, and 310). As shown in the FIGURES, the magnitude of the voltage drop in the good battery is less than that of the relatively low state-of-charge battery and of the bad battery, with the magnitude of the voltage drop of the bad battery being the greatest of the three. Further, it is observed that the voltage of the battery at the end of the voltage drop (labeled as 112, 212, and 312) is greater for the good battery than for the relatively low state-of-charge battery or for the bad battery.

With the capacitors still arranged in parallel, the voltage of the battery recovers as the capacitors continue to charge (shown as regions 120, 220, and 320). The slope of region 220 is greater than that of regions 120 and 320, although the voltage at the end of the recovery period for the bad battery is lower than that of the good battery or the relatively low state-of-charge battery.

After the capacitors have been arranged in parallel for a predetermined amount of time, the switches (e.g., Q1 and Q2) connecting the capacitors in parallel are opened such that all switches (e.g., Q1, Q2, Q3, and Q4). The battery voltage increases sharply, as shown in regions 130, 230, and 330, and then remains relatively stable as shown as regions 140, 240, and 340.

The capacitors (e.g., C1 and C2) are then cycled between an arrangement in which the capacitors are arranged in parallel (e.g., by closing switches Q1 and Q2 and opening switch Q3) and an arrangement in which the capacitors are arranged in series (e.g., by closing switch Q3 and opening switches Q1 and Q2). Cycling between these arrangements may occur at a rate of up to approximately 10 kilohertz. The voltage response of the batteries are shown as regions 150, 250, and 350.

When the capacitors are arranged in series, charge from the capacitors is discharged into the battery, while charge is discharged from the battery and into the capacitors when the capacitors are arranged in parallel. An enlarged view of a portion of the graph shown in FIG. 5 is shown in FIG. 6. The capacitors are initially arranged in parallel, which results in a battery voltage drop (labeled as regions 152 and 252). While the capacitors are charging, the battery voltage recovers (labeled as regions 154 and 254). The capacitors are then arranged in series, which acts to charge the battery and increase the battery voltage (labeled as regions 156 and 256) until the battery voltage reaches a peak prior to arranging the capacitors in parallel again (labeled as regions 158 and 258). Such cycling process may be repeated as many times as may be desired (e.g., to characterize the response of the battery).

After the cycling of the capacitors between series arrangements and parallel arrangements, the switches connecting the capacitors to the battery are opened (e.g., switches Q1, Q2, and Q3 are opened) and the battery voltage remains relatively stable (labeled as regions 150, 250, and 350).

The battery tester may use any of a wide variety of testing algorithms in which capacitors are arranged in series or in parallel to discharge or charge a battery to test or evaluate a battery response. The test illustrated in FIGS. 5–7 is one nonexclusive exemplary embodiment of one such test. The time, frequency, or duration during which the capacitors are cycled may vary according to other exemplary embodiments without departing from the scope of the inventions disclosed herein.

It should also be noted that one or more resistors (e.g., having a resistance higher than that of resistor R1) may be provided in the battery tester to discharge any remaining or residual charge in the capacitors prior, during, or subsequent to testing a battery. The resistor(s) may be provided in an arrangement similar to that shown in FIG. 1 for resistor R1 (e.g., the resistor may have a switch configured to switch the resistor into a circuit with the capacitors) or in any other suitable arrangement.

Rates of charging and discharging may also be varied during testing. For example, a relatively high-rate discharge of the battery may be performed in a first cycle, while a lower rate discharge may be performed in a second or subsequent cycle.

The various elements of the battery test system and circuitry may be made of any of a wide variety of materials as are well known in the art. For example, the advanced battery tester may include circuitry (e.g., microprocessor(s), breadboards, etc.) having any of a variety of devices included therein (e.g., capacitors, transistors, MOSFETs, resistors, inverters, operational amplifiers, etc.).

As will be appreciated by those of skill in the art reviewing this application, a system for testing or evaluating batteries (e.g., a battery tester such as a capacitive tester) of a type disclosed in the present application may include a number of advantageous features.

For example, such a system may utilize capacitors for discharging and for charging a battery during testing of the battery. The capacitors may be arranged in parallel during charging of the capacitors (i.e., during discharge of the battery) and arranged in series during discharge of the capacitors (i.e., during charging of the battery). Instead of a single capacitor, the system may utilize one or more banks of capacitors to obtain the advantages of using a larger capacity capacitor.

The system may be utilized to characterize various features of a battery (e.g., voltage and/or current response during charging/discharging of the battery, impedance of the battery, frequency response of the battery, etc.) by cycling a set of capacitors between a parallel and a series arrangement.

In this manner, the system may be used to characterize at least one of the resistance of a battery, the kinetics of a battery, and the initial resistance of a battery.

A system such as that disclosed herein may also advantageously provide a relatively high current discharge for a battery and relatively high voltage charging of the battery. The system may also be configured such that the system may provide both relatively high-rate discharge of a battery and relatively low-rate discharge of a battery (e.g., cycling or pulsing between high-rate and low-rate discharge). The system may include circuitry that is configured to reduce the amount of heat generated in a battery tester.

It is important to note that the construction and arrangement of the elements of the battery tester circuitry as shown in the preferred and other exemplary embodiments is illustrative only. Although only a few embodiments of the present inventions have been described in detail in this disclosure, those skilled in the art who review this disclosure will readily appreciate that many modifications are possible (e.g., variations in sizes, dimensions, structures, and proportions of the various elements, values of parameters, mounting arrangements, etc.) without materially departing from the novel teachings and advantages of the subject matter recited herein. For example, the circuit diagrams provided are schematic only, and the values for the individual components (e.g., the ratings for the resistors, capacitors, MOSFETs, etc.) may vary according to alternative embodiments. Further, while the description herein may suggest that software is used to control switching of the capacitors from a parallel to a series arrangement, such switching may be accomplished by other means (e.g., a timing circuit, manually, etc.). Even further, while the inventions described herein are described with reference to use with automotive and other vehicle batteries (e.g., 12 V lead-acid batteries), the inventions may be used with any of a variety of different battery types. Instead of providing the capacitor circuitry in a battery tester, the circuitry may be part of an add-on device that is coupled with a battery tester. The position of elements may be reversed or otherwise varied (e.g., the circuit diagram may be modified or may be incorporated in other circuits), and the nature or number of discrete elements or positions may be altered or varied (e.g., instead of having two banks of capacitors, a different number of capacitors may be utilized). Other substitutions, modifications, changes and omissions may be made in the design, operating conditions and arrangement of the preferred and other exemplary embodiments without departing from the scope of the present inventions.

What is claimed is:

1. A system for testing a battery comprising:
   a battery tester electrically coupled to a battery;
   a first capacitor electrically coupled to the battery; and
   a second capacitor electrically coupled to the battery;
   wherein the first capacitor and the second capacitor are configured to be arranged in series in a first arrangement to charge the battery;
   wherein the first capacitor and the second capacitor are configured to be arranged in parallel in a second arrangement to discharge the battery into the first capacitor and the second capacitor;
   wherein the battery tester is configured to characterize a response of the battery to the first capacitor and second capacitor being switched between the first arrangement and the second arrangement.

2. The system of claim 1, wherein at least one of the first capacitor and the second capacitor comprise a plurality of capacitors.

3. The system of claim 1, wherein the first capacitor and the second capacitor are in the second arrangement during discharging of a battery.

4. The system of claim 1, wherein the first capacitor and the second capacitor are in the first arrangement during charging of a battery.

5. The system of claim 1, further comprising a plurality of switches for switching the first capacitor and the second capacitor between the first arrangement and the second arrangement.

6. The system of claim 1, wherein the plurality of switches comprise a first switch, a second switch, and a third switch, wherein the first capacitor and the second capacitor are in the first arrangement when the first switch and the second switch are in an off state and the third switch is in an on state.

7. The system of claim 6, wherein the first capacitor and the second capacitor are in the second arrangement when the first switch and the second switch are in an on state and the third switch is in an off state.

8. The system of claim 1, further comprising a resistive element configured to be arranged in parallel with a battery to measure a voltage of a battery.

9. A system for testing a battery comprising:
   a battery tester electrically coupled to a battery;
   a first group of capacitors electrically coupled to the battery; and
   a second group of capacitors electrically coupled to the battery;
   wherein the first group of capacitors and the second group of capacitors may be selectively switched between a first configuration in which the first group of capacitors and the second group of capacitors are in series with each other to charge the battery and a second configuration in which the first group of capacitors and the second group of capacitors are in parallel with each other to allow the battery to discharge into the capacitors; and
   wherein the battery tester is configured to characterize features of the battery in response to the selective switching.

10. The system of claim 9, wherein at least one of the first group and the second group comprises five capacitors.

11. The system of claim 9, wherein the first group of capacitors and the second group of capacitors are in the first configuration during discharging of a battery.

12. The system of claim 9, wherein the first group of capacitors and the second group of capacitors are in the second configuration during charging of a battery.

13. The system of claim 9, further comprising means for selectively switching the first group of capacitors and the second group of capacitors between the first configuration and the second configuration.

14. The system of claim 13, wherein the means for selectively switching the first group of capacitors and the second group of capacitors between the first configuration and the second configuration comprises a first switch, a second switch, and a third switch, wherein the first group of capacitors and the second group of capacitors are in the first configuration when the first switch and the second switch are in an off state and the third switch is in an on state.

15. The system of claim 14, wherein the first capacitor and the second capacitor are in the second configuration when the first switch and the second switch are in an on state and the third switch is in an off state.

16. A method for testing a battery comprising:
- discharging a battery into a first capacitor and a second capacitor when the first capacitor and the second capacitor are provided in parallel with each other;
- arranging the first capacitor and the second capacitor in series with each other;
- charging the battery by discharging the first capacitor and the second capacitor into the battery when the first capacitor and the second capacitor are in series with each other; and
- characterizing the response to the battery during the discharging and charging steps.

17. The method of claim 16, wherein the step of arranging the first capacitor and the second capacitor in series with each other comprises changing the state of a plurality of switches.

18. The method of claim 16, further comprising cycling the first capacitor and the second capacitor between a series configuration and a parallel configuration.

19. The method of claim 18, further comprising characterizing a response of the battery due to the cycling the first capacitor and the second capacitor between series and parallel configurations.

20. The method of claim 19, wherein the step of characterizing the response of the battery comprises characterizing at least one of a voltage response and a current response of the battery.

* * * * *

UNITED STATES PATENT AND TRADEMARK OFFICE
CERTIFICATE OF CORRECTION

| | | |
|---|---|---|
| PATENT NO. | : 7,119,518 B1 | Page 1 of 1 |
| APPLICATION NO. | : 10/976340 | |
| DATED | : October 10, 2006 | |
| INVENTOR(S) | : Thomas J. Dougherty, Ronald C. Miles and Michael L. Thompson | |

It is certified that error appears in the above-identified patent and that said Letters Patent is hereby corrected as shown below:

Column 11:
line 11, replace "to" with --of--.

Signed and Sealed this

Thirteenth Day of March, 2007

JON W. DUDAS
*Director of the United States Patent and Trademark Office*